(12) United States Patent
Belelie et al.

(10) Patent No.: US 11,143,958 B2
(45) Date of Patent: Oct. 12, 2021

(54) METHOD FOR APPLYING CURABLE GELLANT COMPOSITION FOR DIGITAL EMBOSSING AND OTHER RAISED PRINT APPLICATIONS

(71) Applicant: Xerox Corporation, Norwalk, CT (US)

(72) Inventors: Jennifer L. Belelie, Oakville (CA); Michelle N. Chrétien, Mississauga (CA); Paul J. McConville, Webster, NY (US); Jason O'Neil, Rochester, NY (US); Barkev Keoshkerian, Thornhill (CA); Anthony S. Condello, Webster, NY (US)

(73) Assignee: Xerox Corporation, Norwalk, CT (US)

( * ) Notice: Subject to any disclaimer, the term of this patent is extended or adjusted under 35 U.S.C. 154(b) by 393 days.

(21) Appl. No.: 15/944,883

(22) Filed: Apr. 4, 2018

(65) Prior Publication Data
US 2019/0310550 A1    Oct. 10, 2019

(51) Int. Cl.
*G03F 7/00* (2006.01)
*G03F 7/20* (2006.01)
(Continued)

(52) U.S. Cl.
CPC ........... *G03F 7/0017* (2013.01); *B41M 3/008* (2013.01); *B41M 3/06* (2013.01); *B41M 3/16* (2013.01);
(Continued)

(58) Field of Classification Search
CPC .................................. C08F 2/48; C08L 33/08
See application file for complete search history.

(56) References Cited

U.S. PATENT DOCUMENTS

| 7,259,275 B2 | 5/2007 | Belelie et al. |
| 7,271,284 B2 | 5/2007 | Toma et al. |

(Continued)

OTHER PUBLICATIONS

Scodix press release, found on the world wide web at https://scodix.com/wp-content/uploads/2011/09/Scodix-FinalTouch%E2%84%A2-Printing-Solution-Offers-Technology-Leap-for-European-Commercial-Printing-Market-.pdf, dated Mar. 22, 2011, 1 page.

(Continued)

*Primary Examiner* — Dah-Wei D. Yuan
*Assistant Examiner* — Kristen A Dagenais-Englehart
(74) *Attorney, Agent, or Firm* — Marylou J. Lavoie, Esq. LLC (57) ABSTRACT

A process including providing a substantially flat printed image on a substrate; disposing a curable gellant composition onto the printed image in registration with the printed image, successively depositing additional amounts of the gellant composition to create a raised image in registration with the printed image; and curing the deposited raised image. A process including providing a printed image on a substrate; disposing a curable non-gellant composition onto the printed image in registration with the printed image; and disposing a curable gellant composition onto the printed image in registration with the printed image; to create a raised image in registration with the printed image; and curing the deposited raised image. An ultraviolet curable phase change gellant composition including a radiation curable monomer or prepolymer, a photoinitiator, a silicone polymer or pre-polymer, and a gellant.

17 Claims, 5 Drawing Sheets

(51) Int. Cl.
*C08L 33/08* (2006.01)
*C08L 33/10* (2006.01)
*C08L 83/04* (2006.01)
*B41M 3/00* (2006.01)
*B41M 3/06* (2006.01)
*B41M 3/16* (2006.01)
*B44C 3/02* (2006.01)
*C08F 2/48* (2006.01)

(52) U.S. Cl.
CPC .............. *B44C 3/025* (2013.01); *C08L 33/08* (2013.01); *C08L 33/10* (2013.01); *C08L 83/04* (2013.01); *G03F 7/2047* (2013.01); *C08F 2/48* (2013.01); *C08L 2312/06* (2013.01)

(56) References Cited

U.S. PATENT DOCUMENTS

| | | | |
|---|---|---|---|
| 7,276,614 B2 | 5/2007 | Toma et al. | |
| 7,279,587 B2 | 5/2007 | Odell et al. | |
| 7,563,489 B2 | 7/2009 | Carlini et al. | |
| 7,625,956 B2 | 12/2009 | Odell et al. | |
| 7,632,546 B2 | 12/2009 | Odell et al. | |
| 7,925,043 B2 | 4/2011 | Kazmaier et al. | |
| 8,061,791 B2 | 11/2011 | Iftime et al. | |
| 8,449,102 B2 | 5/2013 | Breton et al. | |
| 8,491,960 B2 | 7/2013 | Kiy | |
| 8,614,806 B2 | 9/2013 | Brewington | |
| 8,651,656 B2 | 2/2014 | Roof et al. | |
| 8,697,194 B2 | 4/2014 | Odell et al. | |
| 8,758,865 B2 | 6/2014 | Belelie et al. | |
| 8,916,084 B2 | 12/2014 | Chretien et al. | |
| 8,939,536 B2 | 1/2015 | Smith | |
| 9,533,497 B2 | 1/2017 | Roof et al. | |
| 2008/0218540 A1* | 9/2008 | Iftime | B41J 3/32 347/8 |
| 2008/0282448 A1 | 11/2008 | Cho | |
| 2009/0258155 A1* | 10/2009 | Odell | B41M 7/009 427/519 |
| 2010/0053287 A1 | 3/2010 | Belelie et al. | |
| 2010/0055407 A1 | 3/2010 | Belelie et al. | |
| 2010/0055423 A1 | 3/2010 | Chretien et al. | |
| 2011/0152396 A1* | 6/2011 | Chretien | C09D 11/101 522/26 |
| 2012/0123014 A1 | 5/2012 | Chretien et al. | |
| 2012/0282448 A1 | 11/2012 | Chretien et al. | |

OTHER PUBLICATIONS

Kodak press release found on the world wide web at http://whattheythink.com/news/2617-kodak-enhances-kodak-nexpress-kodak-digimaster/, 4 pages, dated Jun. 3, 2008.

Canadian Office Action issued in Canadian Application No. 3,038,742, dated Jan. 12, 2021.

Extended European Search Report issued in European Application No. 19166392.1-1014, dated Oct. 7, 2019.

* cited by examiner

METHOD FOR APPLYING CURABLE GELLANT COMPOSITION FOR DIGITAL EMBOSSING AND OTHER RAISED PRINT APPLICATIONS

BACKGROUND

Disclosed herein is a process comprising providing a substantially flat printed image on a substrate; disposing a curable gellant composition onto the printed image in registration with the printed image, wherein the curable gellant composition comprises a radiation curable monomer or prepolymer, a photoinitiator, and a gellant; successively depositing additional amounts of the gellant composition to create a raised image in registration with the printed image; and curing the deposited raised image.

Further disclosed is a process comprising providing a printed image on a substrate; disposing a curable gellant composition onto the printed image in registration with the printed image; and disposing a curable non-gellant composition onto the printed image in registration with the printed image to create a raised image in registration with the printed image; and curing the deposited raised image.

Further disclosed is an ultraviolet curable phase change gellant composition comprising a radiation curable monomer or prepolymer, a photoinitiator, a silicone polymer or pre-polymer, and a gellant.

Raised print is used in many applications including invitations, books, business cards, postcards, greeting cards, Braille, and document authentication. In traditional thermographic processes, fine lines are difficult to emboss, and not all colors are compatible with thermographic processes. In addition, current ink jet techniques can be slow and not in-line with the digital printer.

There are currently very few ways to apply both flat and raised print in the same document using an in-line process.

U.S. Pat. No. 8,491,960, which is hereby incorporated by reference herein in its entirety, describes in the Abstract thereof a method for producing a printed product with raised print includes receiving a prepress format document containing a plurality of flat ink color separations and at least one raised print color separation, printing onto a substrate the flat ink color separations using flat ink and the at least one raised print color separation using dimensional ink, allowing the flat and dimensional ink to dry, heating the inked substrate to a temperature that causes the applied dimensional ink to become sticky, applying thermographic powder to the heated inked substrate such that the thermographic powder sticks to the sticky dimensional ink, removing the thermographic powder from regions of the substrate where the dimensional ink is not applied, reheating the sheet to melt the thermographic powder, and cooling the sheet to result in a print product having both flat and raised printed content. This patent describes a method in which flat ink and dimensional inks are applied to the same document from different heads. Heat is applied to dry the flat inks and make the dimensional inks "sticky." A thermographic powder is applied which sticks only to the dimensional ink; the excess is removed from non-dimensional ink areas. The print is heated again to activate the thermographic effect.

U.S. Pat. No. 7,925,043, which is hereby incorporated by reference herein in its entirety, describes, in embodiments, a system and method to create an authentication mark on a recording medium by depositing marking material on a medium in an image area to create a marking material image and to create a marking material authentication image. A predetermined amount of additional marking material is further deposited upon the medium in the authentication image area to increase an amount of marking material associated with the marking material authentication image in the authentication image area. The fixed marking material associated with the authentication image area is a tactilely perceptible authentication mark wherein the fixed marking material associated with the authentication mark has a height, with respect to a surface of the medium, that is tactilely perceptible.

Scodix Ltd. Rosh Ha'ayin, Israel, produces the Scodix 1200™ UV DigitalEmbossing™ press in which clear ultraviolet curable ink is applied on a CMYK (cyan, magenta, yellow, black) flat-printed sheet offline. After curing, the height of the image is 20 to 80 micrometers.

The Kodak Nexpress S3600, manufactured by Eastman Kodak Company of Rochester, N.Y., applies a clear dimensional ink from a fifth housing in a single pass process during which flat and raised images are produced together. The dimensional ink is applied selectively to specific areas during the CMYK printing process. The achievable thickness using this process is approximately 30 micrometers.

U.S. Pat. No. 8,697,194, which is hereby incorporated by reference herein in its entirety, describes in the Abstract thereof a substantially colorless radiation curable overcoat composition suitable for overcoating ink-based images and xerographic-based images. The overcoat comprising at least one gellant, at least one monomer, at least one substantially non-yellowing photoinitiator, optionally a curable wax, and optionally a surfactant.

While currently available raised print processes may be suitable for their intended purposes, a need remains for improved raised print processes and compositions. Further, a need remains for an improved in-line raised print process and composition for same. Further, a need remains for an in-line raised print process and composition that is capable of achieving raised print heights of above 30 micrometers, such as from about 40 to about 60 micrometers. Further, a need remains for a process and composition for preparing both flat and raised print in an in-line process capable of achieving the desired raised print height of from about 40 to about 60 micrometers in a robust raised print. Further, a need remains for such a process and composition wherein the desired raised print can be disposed over a xerographic image. Moreover, a need remains for raised printing on rough surfaces, and further, for printing without intermediate UV cure (or UV "pinning") between layers. In addition, a need remains for raised printing having increased color compatibility, and a raised printing process with increased speeds.

The appropriate components and process aspects of the each of the foregoing U.S. Patents and Patent Publications may be selected for the present disclosure in embodiments thereof. Further, throughout this application, various publications, patents, and published patent applications are referred to by an identifying citation. The disclosures of the publications, patents, and published patent applications referenced in this application are hereby incorporated by reference into the present disclosure to more fully describe the state of the art to which these embodiments pertain.

SUMMARY

Described is a process comprising providing a substantially flat printed image on a substrate; disposing a curable gellant composition onto the printed image in registration with the printed image, wherein the curable gellant composition comprises a radiation curable monomer or prepolymer, a photoinitiator, and a gellant; successively depositing additional amounts of the gellant composition to create a raised image in registration with the printed image; and curing the deposited raised image.

Also described is a process comprising providing a printed image on a substrate; disposing a curable gellant composition onto the printed image in registration with the printed image; and disposing a curable non-gellant composition onto the printed image in registration with the printed image to create a raised image in registration with the printed image; and curing the deposited raised image.

Also described is an ultraviolet curable phase change gellant composition comprising a radiation curable monomer or prepolymer, a photoinitiator, a silicone polymer or pre-polymer, and a gellant.

DETAILED DESCRIPTION

Ultra-violet curable gellant compositions are provided as materials for digitally embossing xerographic printed images, in embodiments, for digitally embossing printed xerographic images, for example xerographic images printed with a Xerox® iGen® Press, in an in-line process. In embodiments, the ultra-violet curable gellant compositions are substantially free of colorant. The compositions comprise radiation curable monomers and/or oligomers, a photoinitiator, and a gellant. The ultra-violet curable gellant composition exhibits robust jetting at elevated temperatures, such as, for example, having a viscosity of from about 10 to about 15 centipoise at a temperature of about 85° C., and a degree of mechanical stability (for example, from about $10^5$ to about $10^6$ centipoise) at ambient substrate temperatures (i.e., room temperature). The composition drops "pin" in place as the gel composition cools onto the substrate which allows raised print to be built without the need for intermediate cure or ultra-violet radiation pinning while employing several print heads in the process direction. After printing, the markings are fully cured to provide robust raised images or structures.

In embodiments, the process herein enables creation of raised text over a printed image, in embodiments, over a xerographic image, in embodiments a substantially flat printed image, the raised text having a pile height of greater than about 30 micrometers, in embodiments, having a height of from about 30 to about 100 micrometers, or from about 40 to about 80 micrometers, or from about 40 to about 60 micrometers. The process and gellant composition herein is compatible with Xerox® iGen® 150 speeds or speeds of about 585 millimeters/second. The gelation of the gellant composition provides that no intermediate UV curing ("pinning") is required between print heads which provides a less complex and more efficient print process over previously known processes. On plain paper, where the xerographic image, in embodiments, the toner image, does not completely seal the surface, the gelation of the gellant composition prevents it from penetrating into the paper. Paper penetration makes curing to completion difficult and leads to other undesirable effects such as showthrough. Due to the phase change nature of the present gellant composition, the material pins in place during printing. As a result, structures or raised images having a height of greater than about 30 micrometers, or from about 30 to about 100 micrometers, or from about 40 to about 80 micrometers, or from about 40 to about 60 micrometers, or in excess of 1.5 millimeters can be printed without the need for curing between layers. This feature simplifies print architectures using the present gellant compositions and process and provides improved print efficiency and speed.

In embodiments, radiation curable phase change gellant compositions are provided as materials for digitally embossing a printed flat image. In embodiments, the gellant compositions are provided in an in-line process for overprinting an image, in embodiments, for overprinting a substantially flat image, in embodiments, a xerographic image, in specific embodiments, a toner image, in order to "raise" the xerographic image or digitally emboss, if you will, the xerographic image, resulting in a raised image. The gellant composition can be disposed by any suitable or desired technique. Fabrication techniques can include, for example, inkjet-based digital fabrication and rapid prototyping technologies. The gellant compositions are comprised of radiation curable monomers, prepolymers, and/or oligomers, a photoinitiator package, and a gellant. Pigments or other functional particles may be optionally included depending on the desired application. In certain embodiments, the gellant composition is free of colorant; that is, does not contain a colorant compound in the composition. The rheological properties of the present compositions can be tuned to achieve robust jetting at elevated temperatures (for example, in embodiments, about 85° C.) and a degree of mechanical stability (for example, in embodiments, about $10^5$ to about $10^6$ centipoise) at ambient substrate temperatures (i.e., room temperature). The increase in viscosity to from about $10^5$ to from about $10^6$ centipoise allows the raised print to be built up over and in registration with the xerographic image. Before curing, however, the raised print may have a consistency resembling toothpaste and can be altered by touch. By curing, the structures are rendered robust. The gel nature of the present materials at room temperature prevents spread or migration of the printed droplet and allows for facile build-up of three-dimensional structures and raised printed images. Due to the radiation curable nature of this material, the printed raised images can be cured by exposure to ultraviolet radiation at any point in the fabrication process resulting in robust images with a high degree of mechanical strength. In embodiments herein, the radiation curable phase change gellant compositions herein can be cured after deposition of each layer of the raised image is deposited, if desired. Alternately, in the interest of time, the gellant compositions can be cured upon completion of deposition of all layers of the raised image. In embodiments, curing the deposited ultraviolet curable phase change gellant composition comprises curing after the last of the successive additional amounts of the ultraviolet curable phase change gellant composition is deposited.

In embodiments, a process herein comprises providing a printed image on a substrate; disposing a curable phase change gellant composition onto the printed image in registration with the printed image, wherein the curable phase change gellant composition comprises a radiation curable monomer or prepolymer, a photoinitiator, and a gellant; successively depositing additional amounts of the ultraviolet curable phase change gellant composition to create a raised image in registration with the printed image; and curing the deposited ultraviolet curable phase change gellant composition.

In specific embodiments, the process herein is an in-line process comprising printing a xerographic image on a substrate; over printing the xerographic image with a curable phase change gellant composition in registration with the printed xerographic image, in an in-line process, wherein the curable phase change gellant composition comprises a radiation curable monomer or prepolymer, a photoinitiator, and a gellant; successively depositing additional amounts of the ultraviolet curable phase change gellant composition to create a raised image in registration with the printed xerographic image; and curing the deposited ultraviolet curable phase change gellant composition.

In embodiments, the method herein comprises depositing successive layers of the curable gellant composition to form an image having a selected height and shape over and in registration with a flat printed image, in embodiments, over and in registration with a xerographic image. The successive layers of the curable gellant composition can be deposited in order to build up a three-dimensional object or raised print image in a layerwise fashion. In embodiments herein, images of virtually any design can be created over the xerographic image, from a micro-sized scale to a macro-sized scale, and can include simple text images including fine lines and images of objects having complex geometries. The compositions and method herein further advantageously provide a non-contact, additive process (as opposed to a subtractive process such as computer numerical control machining) providing the built-in ability to deliver metered amounts of the present compositions to a precise location in time and space.

In embodiments, the process herein includes providing a printed image on a substrate. The printed image is a substantially flat, or non-raised image. In embodiments, the printed image is a xerographic image. In certain embodiments, the flat printed image and the curable phase change gellant compositions are provided in an in-line process.

In embodiments, the gellant compositions herein are disposed using inkjet printing. In an inkjet printhead, individual piezoelectric, thermal, or acoustic actuators generate mechanical forces that eject ink from an ink filled pressure chamber and through an orifice in response to an electrical voltage signal, sometimes called a firing signal. The amplitude, frequency, or duration of the firing signals affects the amount of ink ejected in each drop. The firing signal is generated by a printhead controller in accordance with image data. An inkjet printer forms a printed image in accordance with the image data by printing a pattern of individual ink drops at particular locations on the image receiving member. The locations where the ink drops landed are sometimes called "ink drop locations," "ink drop positions," or "pixels." Thus, a printing operation can be viewed as the placement of ink drops on an image receiving member in accordance with image data.

In order for printed images to correspond closely to the image data, both in terms of fidelity to the image objects and the colors represented by the image data, the printheads must be registered with reference to the imaging surface and with the other printheads in the printer. Registration of printheads is a process in which the printheads are operated to eject ink in a known pattern and then the printed image of the ejected ink is analyzed to determine the orientation of the printhead with reference to the image receiving surface and to the other printheads in the printer. Operating the printheads in a printer to eject ink in correspondence with image data presumes the printheads are level with a width across the image receiving surface and that all of the inkjet ejectors in the printhead are operational. The presumption regarding the orientations of the printheads, however, cannot be assumed, but must be verified. Additionally, if the conditions for proper operation of the printheads cannot be verified, the analysis of the printed image should generate data that can be used either to adjust the printheads so they better conform to the presumed conditions for printing or to compensate for the deviations of the printheads from the presumed conditions. For further detail, see U.S. Pat. No. 8,939,536, which is hereby incorporated by reference herein in its entirety.

In embodiments, a gellant composition herein is disposed by inkjet printing the gellant composition over a flat image, in embodiments, over a xerographic image. In certain embodiments, a scanner is employed to capture data related to the printed xerographic image and the data is relayed to the inkjet printer in order to control the disposition of the gellant composition in registration with the printed xerographic image.

In embodiments, the gellant compositions herein can comprise any suitable curable monomer or prepolymer. In embodiments, the at least one curable monomer or prepolymer is a multifunctional acrylate or methacrylate compound. Examples of suitable materials include radiation curable monomer compounds, such as acrylate and methacrylate monomer compounds, which are suitable for use as phase change carriers. Specific examples of relatively nonpolar acrylate and methacrylate monomers include (but are not limited to) isobornyl acrylate, isobornyl methacrylate, lauryl acrylate, lauryl methacrylate, isodecylacrylate, isodecylmethacrylate, caprolactone acrylate, 2-phenoxyethyl acrylate, isooctylacrylate, isooctylmethacrylate, butyl acrylate, and the like, as well as mixtures and combinations thereof. In addition, multifunctional acrylate and methacrylate monomers and oligomers can be included in the phase change carrier as reactive diluents and as materials that can increase the crosslink density of the cured image, thereby enhancing the toughness of the cured images. Different monomer and oligomers can also be added to tune the plasticity or elasticity of the cured images. Examples of suitable multifunctional acrylate and methacrylate monomers and oligomers include (but are not limited to) pentaerythritol tetraacrylate, pentaerythritol tetramethacrylate, 1,2-ethylene glycol diacrylate, 1,2-ethylene glycol dimethacrylate, 1,6-hexanediol diacrylate, 1,6-hexanediol dimethacrylate, 1,12-dodecanol diacrylate, 1,12-dodecanol dimethacrylate, tris(2-hydroxy ethyl) isocyanurate triacrylate, propoxylated neopentyl glycol diacrylate (available from Sartomer Co. Inc. as SR 9003), hexanediol diacrylate, tripropylene glycol diacrylate, dipropylene glycol diacrylate, amine modified polyether acrylates (available as Laromer® PO 83 F, PO 8869, and/or PO 8889 (all available from BASF Corporation), trimethylolpropane triacrylate, glycerol propoxylate triacrylate, dipentaerythritol pentaacrylate, dipentaerythritol hexaacrylate, ethoxylated pentaerythritol tetraacrylate (available from Sartomer Co. Inc. as SR 494), and the like, as well as mixtures and combinations thereof. When a reactive diluent is added to the carrier material, the reactive diluent is added in any desired or effective amount, in one embodiment at least about 1 percent by weight of the carrier, and in another embodiment at least about 35 percent by weight of the carrier, and in one embodiment no more than about 80 percent by weight of the carrier, and in another embodiment no more than about 70 percent by weight of the carrier, although the amount of diluent can be outside of these ranges.

In embodiments, the gellant compositions contain at least one compound that can exhibit gel-like behavior in that it undergoes a relatively sharp increase in viscosity over a relatively narrow temperature range when dissolved in a liquid such as those compounds that behave as curable monomers when exposed to radiation such as ultraviolet light. One example of such a liquid curable monomer is a propoxylated neopentyl glycol diacrylate such as SR9003, commercially available from Sartomer Co. Inc.

In one embodiment, some compounds as disclosed herein undergo a change in viscosity of at least about $10^3$ centipoise, in another embodiment at least about $10^5$ centipoise, and in yet another embodiment at least about $10^6$ centipoise over a temperature range of in one embodiment at least about 30° C., in another embodiment at least about 10° C., and in yet another embodiment at least about 5° C., although the viscosity change and temperature range can be outside of these ranges, and compounds that do not undergo changes within these ranges are also included herein.

At least some embodiments of the compounds disclosed herein can form a semi-solid gel at a first temperature. For example, when the compound is incorporated into a phase change composition, this temperature is below the specific temperature at which the composition is jetted. The semi-solid gel phase is a physical gel that exists as a dynamic equilibrium comprising one or more solid gellant molecules and a liquid carrier. The semi-solid gel phase is a dynamic networked assembly of molecular components held together by non-covalent interactions such as hydrogen bonding, Van der Waals interactions, aromatic non-bonding interactions, ionic or coordination bonding, London dispersion forces, or the like, which, upon stimulation by physical forces, such as temperature, mechanical agitation, or the like, or chemical forces, such as pH, ionic strength, or the like, can undergo reversible transitions from liquid to semi-solid state at the macroscopic level. The solutions containing the gellant molecules exhibit a thermally reversible transition between the semi-solid gel state and the liquid state when the temperature is varied above or below the gel point of the solution. This reversible cycle of transitioning between semi-solid gel phase and liquid phase can be repeated many times in the solution formulation.

In embodiments, the gellant compositions disclosed herein can comprise any suitable photoinitiator. Examples of specific initiators include, but are not limited to, Irgacure® 379 and Irgacure® 819, both commercially available from BASF, among others. Further examples of suitable initiators include (but are not limited to) benzophenones, benzyl ketones, monomeric hydroxyl ketones, polymeric hydroxyl ketones, α-alkoxy benzyl ketones, α-amino ketones, acyl phosphine oxides, metallocenes, benzoin ethers, benzil ketals, α-hydroxyalkylphenones, α-aminoalkylphenones, acylphosphine photoinitiators sold under the trade designations of Irgacure® from BASF, and the like. Specific examples include oligo[2-hydroxy-2-methyl-1-[4-(1-methylvinyl)phenyl]propanone (available as IGM Resins Esacure® KIP 150), 1-hydroxy-cyclohexylphenylketone, benzophenone, 2-benzyl-2-(dimethylamino)-1-(4-(4-morphorlinyl)phenyl)-1-butanone, 2-methyl-1-(4-methylthio)phenyl-2-(4-morphorlinyl)-1-propanone, diphenyl-(2,4,6-trimethylbenzoyl) phosphine oxide, phenyl bis(2,4,6-trimethylbenzoyl) phosphine oxide, benzyl-dimethylketal, isopropylthioxanthone, 2,4,6-trimethylbenzoyl-diphenylphosphine oxide (available as BASF Irgacure® TPO), 2,4,6-trimethylbenzoylethoxyphenylphosphine oxide (available as BASF Irgacure® TPO-L), bis(2,4,6-trimethylbenzoyl)-phenyl-phosphine oxide (available as BASF Irgacure® 819) and other acyl phosphines, 2-methyl-1-(4-methylthio)phenyl-2-(4-morphorlinyl)-1-propanone (available as BASF Irgacure® 907) and 1-(4-(2-hydroxyethoxy)phenyl)-2-hydroxy-2-methylpropan-1-one (available as BASF Irgacure® 2959), 2-benzyl 2-dimethylamino 1-(4-morpholinophenyl) butanone-1 (available as BASF Irgacure® 369), 2-dimethylamino-2-(4-methylbenzyl)-1-(4-morpholin-4-ylphenyl)-butanone (available as BASF Irgacure® 379), titanocenes, isopropylthioxanthone, 1-hydroxy-cyclohexylphenylketone, benzophenone, 2,4,6-trimethylbenzophenone, 4-methylbenzophenone, diphenyl-(2,4,6-trimethylbenzoyl) phosphine oxide, 2,4,6-trimethylbenzoylphenylphosphinic acid ethyl ester, oligo(2-hydroxy-2-methyl-1-(4-(1-methylvinyl)phenyl) propanone), 2-hydroxy-2-methyl-1-phenyl-1-propanone, benzyl-dimethylketal, and the like, as well as mixtures thereof.

Optionally, the gellant compositions can also contain an amine synergist, which are co-initiators which can donate a hydrogen atom to a photoinitiator and thereby form a radical species that initiates polymerization, and can also consume dissolved oxygen, which inhibits free-radical polymerization, thereby increasing the speed of polymerization. Examples of suitable amine synergists include (but are not limited to) ethyl-4-dimethylaminobenzoate, 2-ethylhexyl-4-dimethylaminobenzoate, and the like, as well as mixtures thereof.

Initiators for compositions disclosed herein can absorb radiation at any desired or effective wavelength, in one embodiment at least about 200 nanometers to about 560 nanometers, or from about 200 nanometers to about 420 nanometers, although the wavelength can be outside of these ranges.

Optionally, the photoinitiator is present in the UV curable composition in any desired or effective amount, in one embodiment at least about 0.5 percent by weight of the UV curable composition, and in another embodiment at least about 1 percent by weight of the UV curable composition, and in one embodiment no more than about 15 percent by weight of the UV curable composition, and in another embodiment no more than about 10 percent by weight of the UV curable composition, although the amount can be outside of these ranges.

The curable monomer or prepolymer can form more than about 50% by weight of the UV curable composition, or at least 70% by weight of the UV curable composition, or at least 80% by weight of the UV curable composition, although not limited. In embodiments, the curable monomer or prepolymer can be included in an amount of from about 50% to about 80%, or from about 50% to about 70%, by weight, based upon the total weight of the UV curable composition.

As used herein, in embodiments, gellant is any material capable of forming a dynamic networked assembly of molecular components held together by non-covalent interactions such as hydrogen bonding, Van der Waals interactions, aromatic non-bonding interactions, ionic or coordination bonding, London dispersion forces, or the like, which, upon stimulation by physical forces, such as temperature, mechanical agitation, or the like, or chemical forces, such as pH, ionic strength, or the like, can undergo reversible transitions from liquid to semi-solid state at the macroscopic level. The solutions containing the gellant molecules exhibit a thermally reversible transition between the semi-solid gel state and the liquid state when the temperature is varied above or below the gel point of the solution. This reversible cycle of transitioning between semi-solid gel phase and liquid phase can be repeated many times in the solution formulation.

Any suitable gellant can be used for the compositions herein. In embodiments, gellants suitable for use in the compositions herein include a curable gellant comprised of a curable polyamide-epoxide acrylate component and a polyamide component, a curable composite gellant comprises of a curable epoxy resin and a polyamide resin, amide gellants, and the like.

In embodiments, a gellant such as described in U.S. Pat. No. 7,625,956, the disclosure of which is totally incorporated herein by reference, can be used, wherein the gellant is a compound of the formula wherein $R_1$ is:

(i) an alkylene group (wherein an alkylene group is defined as a divalent aliphatic group or alkyl group, including linear and branched, saturated and unsaturated, cyclic and acyclic, and substituted and unsubstituted alkylene groups, and wherein heteroatoms, such as oxygen, nitrogen, sulfur, silicon, phosphorus, boron, and the like either may or may not be present in the alkylene group), in one embodiment with at least 1 carbon atom to about 12 carbon atoms, or from about 1 to about 4 carbon atoms, or with no more than about 2 carbon atoms, although the number of carbon atoms can be outside of these ranges, (ii) an arylene group (wherein an arylene group is defined as a divalent aromatic group or aryl group, including substituted and unsubstituted arylene groups, and wherein heteroatoms, such as oxygen, nitrogen, sulfur, silicon, phosphorus, boron, and the like either may or may not be present in the arylene group), in one embodiment with at least about 5 carbon atoms to about 14 carbon atoms, or from about 6 carbon atoms, and in one embodiment with no more than to about 14 carbon atoms, or from about 6 to about 10 carbon atoms, or with no more than about 6 carbon atoms, although the number of carbon atoms can be outside of these ranges, (iii) an arylalkylene group (wherein an arylalkylene group is defined as a divalent arylalkyl group, including substituted and unsubstituted arylalkylene groups, wherein the alkyl portion of the arylalkylene group can be linear or branched, saturated or unsaturated, and cyclic or acyclic, and wherein heteroatoms, such as oxygen, nitrogen, sulfur, silicon, phosphorus, boron, and the like either may or may not be present in either the aryl or the alkyl portion of the arylalkylene group), in one embodiment with at least about 6 carbon atoms to about 32 carbon atoms, or with at least about 7 carbon atoms to about 22 carbon atoms, although the number of carbon atoms can be outside of these ranges, or (iv) an alkylarylene group (wherein an alkylarylene group is defined as a divalent alkylaryl group, including substituted and unsubstituted alkylarylene groups, wherein the alkyl portion of the alkylarylene group can be linear or branched, saturated or unsaturated, and cyclic or acyclic, and wherein heteroatoms, such as oxygen, nitrogen, sulfur, silicon, phosphorus, boron, and the like either may or may not be present in either the aryl or the alkyl portion of the alkylarylene group), in one embodiment with from about 6 to about 32 carbon atoms, or from about 7 to about 22 carbon atoms, although the number of carbon atoms can be outside of these ranges, wherein the substituents on the substituted alkylene, arylene, arylalkylene, and alkylarylene groups can be (but are not limited to) halogen atoms, cyano groups, pyridine groups, pyridinium groups, ether groups, aldehyde groups, ketone groups, ester groups, amide groups, carbonyl groups, thiocarbonyl groups, sulfide groups, nitro groups, nitroso groups, acyl groups, azo groups, urethane groups, urea groups, mixtures thereof, and the like, wherein two or more substituents can be joined together to form a ring;

$R_2$ and $R_2'$ each, independently of the other, are:

(i) alkylene groups (wherein an alkylene group is defined as a divalent aliphatic group or alkyl group, including linear and branched, saturated and unsaturated, cyclic and acyclic, and substituted and unsubstituted alkylene groups, and wherein heteroatoms, such as oxygen, nitrogen, sulfur, silicon, phosphorus, boron, and the like either may or may not be present in the alkylene group), in one embodiment with at least 1 carbon atom to about 54 carbon atoms, or from about 1 to about 36 carbon atoms, although the number of carbon atoms can be outside of these ranges, (ii) arylene groups (wherein an arylene group is defined as a divalent aromatic group or aryl group, including substituted and unsubstituted arylene groups, and wherein heteroatoms, such as oxygen, nitrogen, sulfur, silicon, phosphorus, boron, and the like either may or may not be present in the arylene group), in one embodiment with at least about 5 carbon atoms to about 14 carbon atoms, or from about 6 carbon atoms to about 10 carbon atoms, or with about 7 to about 10 carbon atoms, although the number of carbon atoms can be outside of these ranges, (iii) arylalkylene groups (wherein an arylalkylene group is defined as a divalent arylalkyl group, including substituted and unsubstituted arylalkylene groups, wherein the alkyl portion of the arylalkylene group can be linear or branched, saturated or unsaturated, and cyclic or acyclic, and wherein heteroatoms, such as oxygen, nitrogen, sulfur, silicon, phosphorus, boron, and the like either may or may not be present in either the aryl or the alkyl portion of the arylalkylene group), in one embodiment with at least about 6 carbon atoms to about 32 carbons atoms, or with at least about 7 to about 22 carbon atoms, or with no more about 8 carbon atoms, although the number of carbon atoms can be outside of these ranges, or (iv) alkylarylene groups (wherein an alkylarylene group is defined as a divalent alkylaryl group, including substituted and unsubstituted alkylarylene groups, wherein the alkyl portion of the alkylarylene group can be linear or branched, saturated or unsaturated, and cyclic or acyclic, and wherein heteroatoms, such as oxygen, nitrogen, sulfur, silicon, phosphorus, boron, and the like either may or may not be present in either the aryl or the alkyl portion of the alkylarylene group), in one embodiment with at least about 6 carbon atoms, and in another embodiment with at least about 7 to about 32 carbon atoms, or with about 7 to about 22 carbon atoms, although the number of carbon atoms can be outside of these ranges, wherein the substituents on the substituted alkylene, arylene, arylalkylene, and alkylarylene groups can be (but are not limited to) halogen atoms, cyano groups, ether groups, aldehyde groups, ketone groups, ester groups, amide groups, carbonyl groups, thiocarbonyl groups, phosphine groups, phosphonium groups, phosphate groups, nitrile groups, mercapto groups, nitro groups, nitroso groups, acyl groups, acid anhydride groups, azide groups, azo groups, cyanato groups, urethane groups, urea groups, mixtures thereof, and the like, wherein two or more substituents can be joined together to form a ring;

$R_3$ and $R_3'$ each, independently of the other, are a group which is:

(i) an alkyl group (including linear and branched, saturated and unsaturated, cyclic and acyclic, and substituted and unsubstituted alkyl groups, and wherein heteroatoms, such as oxygen, nitrogen, sulfur, silicon, phosphorus, boron, and the like either may or may not be present in the alkyl group), in one embodiment with at least about 2 carbon atoms to about 100 carbon atoms, or with at least about 3 to about 60 carbon atoms, or with at least about 4 to about 30 carbon atoms, although the number of carbon atoms can be outside of these ranges, (ii) an aryl group (including substituted and unsubstituted aryl groups, and wherein heteroatoms, such as oxygen, nitrogen, sulfur, silicon, phosphorus, boron, and the like either may or may not be present in the aryl group), in one embodiment with at least about 5 to about 100 carbon atoms, or with at least about 6 to about 60 carbon atoms, or with about 6 to about 30 carbon atoms, although the number of carbon atoms can be outside of these ranges, such as phenyl or the like, (iii) an arylalkyl group (including substituted and unsubstituted arylalkyl groups, wherein the alkyl portion of the arylalkyl group can be linear or branched, saturated or unsaturated, and cyclic or acyclic, and wherein heteroatoms, such as oxygen, nitrogen, sulfur, silicon, phosphorus, boron, and the like either may or may not be present in either the aryl or the alkyl portion of the arylalkyl group), in one embodiment with at least about 6 to about 100 carbon atoms, or with about 7 to about 60 carbon atoms, or with about 7 to about 30 carbon atoms, although the number of carbon atoms can be outside of these ranges, such as benzyl or the like, or (iv) an alkylaryl group (including substituted and unsubstituted alkylaryl groups, wherein the alkyl portion of the alkylaryl group can be linear or branched, saturated or unsaturated, and cyclic or acyclic, and wherein heteroatoms, such as oxygen, nitrogen, sulfur, silicon, phosphorus, boron, and the like either may or may not be present in either the aryl or the alkyl portion of the alkylaryl group), in one embodiment with at least about 6 to about 100 carbon atoms, or from about 7 to about 60 carbon atoms, or from about 7 to about 30 carbon atoms, although the number of carbon atoms can be outside of these ranges, such as tolyl or the like, wherein the substituents on the substituted alkyl, arylalkyl, and alkylaryl groups can be (but are not limited to) halogen atoms, ether groups, aldehyde groups, ketone groups, ester groups, amide groups, carbonyl groups, thiocarbonyl groups, sulfide groups, phosphine groups, phosphonium groups, phosphate groups, nitrile groups, mercapto groups, nitro groups, nitroso groups, acyl groups, acid anhydride groups, azide groups, azo groups, cyanato groups, isocyanato groups, thiocyanato groups, isothiocyanato groups, carboxylate groups, carboxylic acid groups, urethane groups, urea groups, mixtures thereof, and the like, wherein two or more substituents can be joined together to form a ring;

X and X' each, independently of the other, is an oxygen atom or a group of the formula —$NR_4$—, wherein $R_4$ is:

(i) a hydrogen atom;

(ii) an alkyl group, including linear and branched, saturated and unsaturated, cyclic and acyclic, and substituted and unsubstituted alkyl groups, and wherein heteroatoms either may or may not be present in the alkyl group, in one embodiment with at least 1 carbon atom to about 100 carbon atoms, or from about 1 to about 60 carbon atoms, or from about 1 to about 30 carbon atoms, although the number of carbon atoms can be outside of these ranges, (iii) an aryl group, including substituted and unsubstituted aryl groups, and wherein heteroatoms either may or may not be present in the aryl group, in one embodiment with at least about 5 to about 100 carbon atoms, or from about 6 to about 100 carbon atoms, or from about 6 to about 30 carbon atoms, although the number of carbon atoms can be outside of these ranges,

(iv) an arylalkyl group, including substituted and unsubstituted arylalkyl groups, wherein the alkyl portion of the arylalkyl group can be linear or branched, saturated or unsaturated, and cyclic or acyclic, and wherein heteroatoms either may or may not be present in either the aryl or the alkyl portion of the arylalkyl group, in one embodiment with at least about 6 carbon atoms, and in another embodiment with at least about 7 to about 100 carbon atoms, or from about 7 to about 60 carbon atoms, or from about 7 to about 30 carbon atoms, although the number of carbon atoms can be outside of these ranges, or (v) an alkylaryl group, including substituted and unsubstituted alkylaryl groups, wherein the alkyl portion of the alkylaryl group can be linear or branched, saturated or unsaturated, and cyclic or acyclic, and wherein heteroatoms either may or may not be present in either the aryl or the alkyl portion of the alkylaryl group, in one embodiment with at least about 6 to about 100 carbon atoms, or from about 7 to about 100 carbon atoms, or from about 7 to about 30 carbon atoms, although the number of carbon atoms can be outside of these ranges, wherein the substituents on the substituted alkyl, aryl, arylalkyl, and alkylaryl groups can be (but are not limited to) halogen atoms, ether groups, aldehyde groups, ketone groups, ester groups, amide groups, carbonyl groups, thiocarbonyl groups, sulfate groups, sulfonate groups, sulfonic acid groups, sulfide groups, sulfoxide groups, phosphine groups, phosphonium groups, phosphate groups, nitrile groups, mercapto groups, nitro groups, nitroso groups, sulfone groups, acyl groups, acid anhydride groups, azide groups, azo groups, cyanato groups, isocyanato groups, thiocyanato groups, isothiocyanato groups, carboxylate groups, carboxylic acid groups, urethane groups, urea groups, mixtures thereof, and the like, wherein two or more substituents can be joined together to form a ring.

In one specific embodiment, $R_2$ and $R_2'$ are the same as each other; in another specific embodiment, $R_2$ and $R_2'$ are different from each other. In one specific embodiment, $R_3$ and $R_3'$ are the same as each other; in another specific embodiment, $R_3$ and $R_3'$ are different from each other.

In one specific embodiment, $R_2$ and $R_2'$ are each groups of the formula —$C_{34}H_{56+a}$— and are branched alkylene groups which may include unsaturations and cyclic groups, wherein a is an integer of 0, 1, 2, 3, 4, 5, 6, 7, 8, 9, 10, 11, or 12, including (but not limited to) isomers of the formula In one specific embodiment, $R_1$ is an ethylene ($-CH_2CH_2-$) group.

In one specific embodiment, $R_3$ and $R_3{}'$ are both

In one specific embodiment, the compound is of the formula wherein $-C_{34}H_{56+a}-$ represents a branched alkylene group which may include unsaturations and cyclic groups, wherein a is an integer of 0, 1, 2, 3, 4, 5, 6, 7, 8, 9, 10, 11, or 12, including (but not limited to) isomers of the formula Suitable composite gellants comprised of a curable epoxy resin and a polyamide resin as disclosed in U.S. Pat. No. 7,563,489, which is hereby incorporated by reference herein in its entirety, can also be selected in embodiments herein.

Suitable gellants comprised of a curable polyamide-epoxy acrylate component and a polyamide component as disclosed in U.S. Pat. No. 7,632,546, which is hereby incorporated by reference herein in its entirety, can also be selected in embodiments herein.

Amide gellants as disclosed in U.S. Pat. Nos. 7,276,614 and 7,279,587, which are each hereby incorporated by reference herein in their entireties, can also be selected in embodiments herein.

The gellant may be included in the UV curable composition in any suitable or desired amount. In embodiments, the gellant is included in an amount of from about 1 to about 50 percent by weight, or from about 2 to about 20 percent by weight, or from about 3 to about 10 percent by weight, based on the total weight of the UV curable composition.

In embodiments, the UV curable compositions include a silicone polymer or pre-polymer. Any suitable or desired silicone polymer or pre-polymer can be selected. For example, a linear di-functional acrylate-terminated silicone pre-polymer sold under the name ACR Di-50 is Silmer®, available from Siltech Corporation, can be selected. Dow Corning® 31-441 additive, a solid silicone polymer used as an additive in polyamide-based composites available from Dow Corning Corporation, can also be selected.

In embodiments, the UV curable compositions herein are substantially colorless. As used herein, "substantially colorless" refers to the composition being substantially or completely transparent or clear prior to and after undergoing curing. For this, the UV curable composition may be substantially free of colorants. The UV curable composition herein does not yellow upon curing and remains substantially or completely transparent and clear; that is, little or no measurable difference in any of L* a* b* values, or K, C, M, Y is observed. Being "substantially non-yellowing" or "substantially or completely transparent or clear" refers to the UV curable compositions changing color or hue upon curing in an amount of less that about 15 percent, or less than about 10 percent, or less than about 5 percent, for example, about zero percent.

In embodiments, the UV curable composition is substantially or completely free of colorants, such as pigments, dyes, or mixtures thereof.

In other embodiments, the UV curable composition may include one or more optional colorants. The optional colorant, if present, may be present in in any suitable or desired amount, for example from about 0.5 to about 75 percent by weight, or about 1 to about 50 percent by weight, or from about 1 to about 25 percent by weight, based on the total weight of the UV curable composition.

Any suitable colorant can be used in embodiments herein, including dyes, pigments, or combinations thereof. As colorants, examples may include any dye or pigment capable of being dispersed or dissolved in the vehicle.

Examples of suitable pigments include, for example, Paliogen Red Violet 5411 (BASF); Heliogen Green L8730 (BASF); Sunfast® Blue 15:4 (Sun Chemical); Hostaperm Blue B4G (Clariant); Permanent Red P-F7RK; Hostaperm Violet RL 02 (Clariant); Paliogen Red 3580 K (BASF); SunBrite Yellow 155; Heliogen Blue L 6600 F, L7085 (BASF); Heliogen Blue K6902, K6911 (BASF); Heliogen Blue D6700, D7079 (BASF); Paliogen Blue 6470 (BASF); Sudan Orange 220 (BASF); Paliotol Yellow K 1841 (BASF); Novoperm Yellow FGL (Clariant); Hostaperm Pink E 02 (Clariant); Hansa Brilliant Yellow 5GX03 (Clariant); Permanent Yellow GRL 03 (Clariant); Permanent Rubine F6B (Clariant); Cinquasia Magenta (BASF); Paliogen Black L0086 (BASF); and carbon blacks such as REGAL® 350A120 and 250R (Cabot), mixtures thereof and the like.

The radiation curable gellant compositions herein can also optionally contain an antioxidant. The optional antioxidants can protect the images from oxidation and can also protect the components from oxidation during the heating portion of the preparation process. Specific examples of suitable antioxidant stabilizers include (but are not limited to) NAUGARD® 445 and NAUGARD® 1-403, commercially available from Addivant, Danbury, Conn.; IRGANOX® 1010 and IRGASTAB® UV 22, commercially available from BASF; GENORAD 16 and GENORAD 40 commercially available from Rahn AG, Zurich, Switzerland, and the like, as well as mixtures thereof. When present, the optional antioxidant is present in any desired or effective amount, in one embodiment at least about 0.01 percent by weight of the carrier, in another embodiment at least about 0.1 percent by weight of the carrier, and in yet another embodiment at least about 1 percent by weight of the carrier, and in one embodiment no more than about 20 percent by weight of the carrier, in another embodiment no more than about 5 percent by weight of the carrier, and in yet another embodiment no more than about 3 percent by weight of the carrier, although the amount can be outside of these ranges.

The radiation curable gellant compositions can also, if desired, contain additives to take advantage of the known functionality associated with such additives. Such additives may include, for example, defoamers, slip and leveling agents, pigment dispersants, surfactants, and the like, as well as mixtures thereof. The compositions can also include additional monomeric or polymeric materials as desired.

Curing of the present compositions can be effected by exposure of the resulting image to actinic radiation at any desired or effective wavelength, in one embodiment at least about 200 nanometers, and one embodiment no more than about 480 nanometers, although the wavelength can be outside of these ranges. Exposure to actinic radiation can be for any desired or effective period of time, in one embodiment for at least about 0.2 second, in another embodiment for at least about 1 second, and in yet another embodiment for at least about 5 seconds, and in one embodiment for no more than about 30 seconds, and in another embodiment for no more than about 15 seconds, although the exposure period can be outside of these ranges. By curing is meant that the curable compounds in the formulation undergo an increase in molecular weight upon exposure to actinic radiation, such as (but not limited to) crosslinking, chain lengthening, or the like.

The radiation curable compositions generally have melt viscosities at the jetting temperature (in one embodiment no lower than about 50° C., in another embodiment no lower than about 60° C., and in yet another embodiment no lower than about 70° C., and in one embodiment no higher than about 120° C., and in another embodiment no higher than about 110° C., although the jetting temperature can be outside of these ranges) in one embodiment of no more than about 30 centipoise, in another embodiment of no more than about 20 centipoise, and in yet another embodiment of no more than about 15 centipoise, and in one embodiment of no less than about 2 centipoise, in another embodiment of no less than about 5 centipoise, and in yet another embodiment of no less than about 7 centipoise, although the melt viscosity can be outside of these ranges.

In one specific embodiment, the compositions are jetted at low temperatures, in particular at temperatures below about 110° C., in one embodiment from about 40° C. to about 110° C., in another embodiment from about 50° C. to about 110° C., and in yet another embodiment from about 60° C. to about 90° C., although the jetting temperature can be outside of these ranges. At such low jetting temperatures, the conventional use of temperature differential between the jetted composition and the substrate upon which the composition is jetted to effect a rapid phase change in the composition (i.e., from liquid to solid) may not be effective. The gellant can thus be used to effect a rapid viscosity increase in the jetted composition upon the substrate. In particular, jetted composition droplets can be pinned into position on a receiving substrate such as a final recording substrate, such as paper or transparency material, or an intermediate transfer member, such as a transfuse drum or belt, that is maintained at a temperature cooler than the composition jetting temperature of the composition through the action of a phase change transition in which the composition undergoes a significant viscosity change from a liquid state to a gel state (or semi-solid state).

In some embodiments, the temperature at which the composition forms the gel state is any temperature below the jetting temperature, in one embodiment any temperature that is about 5° C. or more below the jetting temperature. In one embodiment, the gel state can be formed at a temperature of at least about 25° C., and in another embodiment at a temperature of at least about 30° C., and in one embodiment of no more than about 100° C., in another embodiment of no more than about 70° C., and in yet another embodiment of no more than about 50° C., although the temperature can be outside of these ranges. A rapid and large increase in composition viscosity occurs upon cooling from the jetting temperature, at which the composition is in a liquid state, to the gel temperature, at which the composition is in the gel state. The viscosity increase is in one specific embodiment at least a $10^{25}$-fold increase in viscosity.

In embodiments, the present process comprises employing a combination of curable gellant composition and non-gellant curable composition, used in concert with one another. In this embodiment, a smooth finish for solid fill areas is achieved as well as increased ability for controlled patterning. After printing, the markings are cured to provide robust structures. In embodiments, a curable gellant composition and a non-gellant curable composition are printed sequentially over a substantially flat image and cured to create a raised image. In certain embodiments, the curable gellant composition is disposed over the printed flat image first, the non-gellant curable composition is disposed over the printed flat image second (that is, the non-gellant curable composition is disposed after or over the disposed curable gellant composition) and curing is performed, in embodiments, curing is performed after all of the curable gellant composition and non-gellant curable composition layers are disposed.

Thus, in certain embodiments, a combination of curable gellant composition and non-gellant curable composition are employed to digitally emboss prints, such as Xerox® iGen® prints, in an in-line process. In embodiments, the non-gellant composition comprises radiation curable monomers and/or oligomers, a photoinitiator package, and a wetting agent. The non-gellant composition is free of, that is, does not contain, a gellant. The radiation curable monomers and/or oligomers, photoinitiator, and wetting agent can be selected from those described hereinabove for the gellant containing compositions. In embodiments, the curable gellant composition comprises a radiation curable monomer or prepolymer, a photoinitiator, an optional silicone polymer or prepolymer, and a gellant; and can be as described above.

In embodiments, the curable non-gellant composition and curable gellant composition are each printed separately over a printed image on a substrate, in registration with the printed image. The curable non-gellant composition and curable gellant composition can be printed in one or more layers over the printed image, in any suitable or desired fashion, such as successively alternating one or more layers of curable non-gellant composition and curable gellant composition.

In embodiments, the curable gellant composition and the curable non-gellant composition are disposed sequentially onto the printed image; wherein the curable gellant composition is disposed first and the curable non-gellant composition is disposed second.

In embodiments, the wetting agent is specifically selected for the fuser roll oil. Examples of suitable wettings agents include ACR Di-10, a Silmer® silicone acrylate pre-polymer, available from Siltech Corporation; ACR Di-50, a Silmer® linear di-functional acrylate-terminated silicone pre-polymer, available from Siltech Corporation; Siltech® C-20, a carbinol functional silicone glycol copolymer, available from Siltech Corporation; Siltech® C-42, a silicone polyether copolymer, available from Siltech Corporation; BYK-UV 3510, a silicone-containing surface additive from BYK; Dow Corning® 31-441, a solid silicone polymer used as an additive in polyamide-based composites, available from Dow Corning Corporation; and mixtures thereof.

The UV gellant composition additionally contains a gellant. In embodiments, the gellant is selected from the gellants described hereinabove. The gel compositions have robust jetting at elevated temperatures (10-15 cPs) and a degree of mechanical stability ($10^5$-$10^6$ cPs) at ambient substrate temperatures (i.e., room temperature). The UV gellant composition drops "pin" in place as the gel cools onto the substrate which allows raised print to be built without the need for intermediate cure or UV pinning while employing several printheads in the process direction. After printing, the markings are fully cured to provide robust structures. When both the gellant and non-gellant compositions are printed together, solids fills appear "smoother," and patterning is more controllable.

In embodiments of the present process, a pile height for text is from about 40 to about 60 micrometers. Several Xerox® M-class printheads meet this specification and are compatible with iGen®150 speeds or 585 mm/s. As with the embodiments described above, the gelation of the composition provides that no UV pinning is required between printheads which leads to a less complex and more efficient print process. Further, on rough paper, where the xerographic printed image does not completely seal the surface, the gelation stops the UV curable gellant composition from penetrating into the paper. Paper penetration makes curing to completion difficult and leads to other undesirable effects such as showthrough.

The compositions can be prepared by any desired or suitable method. For example, the ingredients can be mixed together, followed by heating, to a temperature in one embodiment of at least about 80° C., and in one embodiment of no more than about 120° C., although the temperature can be outside of these ranges, and stirring until a homogeneous composition is obtained, followed by cooling the composition to ambient temperature (typically from about 20° C. to about 25° C.). The compositions are gels at ambient temperature.

The UV curable compositions can be used in an image process, in embodiments an in-line imaging process, comprising generating an ink based or xerographic based image on a substrate, following the generation of the image, ink jetting the present gellant composition onto the generated image in registration therewith in one or successive layers in accordance with the desired raised image height, and curing the deposited gellant composition.

The present ultraviolet curable gellant materials, as well as the methods herein, can be employed with any desired printing system including systems suitable for preparing three-dimensional objects, such as a solid object printer, thermal ink jet printer (both with inks liquid at room temperature and with phase change inks), piezoelectric ink jet printer (both with inks liquid at room temperature and with phase change inks), acoustic ink jet printer (both with inks liquid at room temperature and with phase change inks), thermal transfer printer, gravure printer, electrostatographic printing methods (both those employing dry marking materials and those employing liquid marking materials), and the like. In alternate embodiments, the UV curable materials can be used for manual preparation of three-dimensional objects, such as through the use of molds or by manual deposition of the material, to prepare a desired three-dimensional object.

In a specific embodiment, an ink jet printing device as described in U.S. Pat. No. 8,061,791, which is hereby incorporated by reference herein in its entirety, can be employed. The ink jet printing apparatus includes at least an ink jet print head and a print region surface toward which ink is jetted from the ink jet print head, wherein a height distance between the ink jet print head and the print region surface is adjustable. Therein, the ink jet print head is adjustable in spacing with respect to the print region surface so as to permit the ink jet print head to be moved from the a first position for regular height printing to a second height distance that is greater than (that is, the spacing between the ink jet print head and the print region surface is greater than) the first height distance. The second height distance is not fixed, and can be varied as necessary for a given printing. Moreover, the second height distance can itself be changed during a printing, as necessary. For example, it may be desirable to adjust the height distance from the first position to a second position as an image is built-up by the ink jet print head, and then as the image continues to be built-up, to adjust the ink jet print head from the second position to a third position in which the spacing from the print region surface is even further increased, and so on as necessary to complete build-up of the object or raised text image.

The present disclosure encompasses fabrication of raised images or objects ranging from extremely small objects to extremely large objects. For example, objects of from about 1 micrometer to about to about 10,000 micrometers in height or longest dimension can be prepared, although the height is not limited to these ranges. An appropriate number of passes or ink jettings may be selected so that object can be built up to a desired total print height and a desired shape.

In three-dimensional printing, the printhead or target stage is movable in three dimensions, x, y, and z, enabling the build up of an object of any desired size. There are no limits to the height or overall size of an object that can be created; however, very large objects may require intermediate curing in the deposition process. In building up an image, for example by way of multiple passes of the print head over the portions of the image to include raised images, by depositing successive layers of ink so that the object, or a section of the object has a desired print height and geometry.

The ink jet head may support single color or full color printing. In full color printing, the ink jet head typically includes different channels for printing the different colors. The ink jet head may include four different sets of channels, for example one for each of cyan, magenta, yellow and black. In such embodiments, the print head is capable of printing either full color regular height prints when the ink jet head is set at a minimum distance from the print region surface, or raised height prints of any color when the ink jet head is at a distance greater than the minimum distance from the print region surface.

For example, the three dimensional objects can be formed with appropriate multiple passing of the ink jet print head over an area to achieve the desired object height and geometry. Jetting of ink from multiple different ink jets of the ink jet head toward a same location of the image during a single pass may also be used to form raised height objects. As discussed above, in embodiments, each layer of ink may add from about 4 µm to about 80 µm in height to the image height. Knowing the total print height desired the appropriate number of passes or jettings may be readily determined.

A controller may then control the ink jet print head to deposit the appropriate amount and/or layers of ink at locations of the image so as to obtain the image with the desired print heights and overall geometries therein.

The three-dimensional objects or raised text images prepared herein can be free standing parts or objects, rapid prototyping devices, raised structures on substrates, such as, for example, topographical maps, or other desired objects. In embodiments, the raised image created by the processes herein is a Braille image.

Any suitable substrate, recording sheet, or removable support, stage, platform, and the like, can be employed, including plain papers such as XEROX® 4024 papers, XEROX® Image Series papers, Courtland 4024 DP paper, ruled notebook paper, bond paper, silica coated papers such as Sharp Company silica coated paper, JuJo paper, HAMMERMILL LASERPRINT® paper, and the like, glossy coated papers such as XEROX® Digital Color Gloss, Sappi Warren Papers LUSTROGLOSS®, and the like, transparency materials, fabrics, textile products, plastics, polymeric films, inorganic substrates such as metals and wood, as well as meltable or dissolvable substrates, such as waxes or salts, in the case of removable supports for free standing objects, and the like.

In embodiments, the substrate is one on which a xerographic image has been printed. In certain embodiments, xerographic image is a toner image. In embodiments, when digitally embossing a xerographic based image in accordance with the present embodiments, the fused xerographic based print is first obtained and then subjected to an ink jet printer containing the present curable phase change gellant composition. The xerographic based print can be prepared by any suitable conventional xerographic technique or variant thereof. In embodiments, the xerographic based print and the curable phase change gellant composition forming the raised image thereover are accomplished in an in-line process.

In embodiments, when digitally embossing an ink based image, the ink based image can be generated first and then subjected to an ink jet printer containing the present curable phase change gellant composition. In embodiments, this is accomplished in an in-line process.

EXAMPLES

The following Examples are being submitted to further define various species of the present disclosure. These Examples are intended to be illustrative only and are not intended to limit the scope of the present disclosure. Also, parts and percentages are by weight unless otherwise indicated.

The following components were used to prepare the Examples provided below.

SR 9003 is a difunctional acrylate monomer (propoxylated neopentyl glycol diacrylate) available from Sartomer Co., Inc.).

Amide Gellant is a curable amide gellant prepared as described in Example VIII of U.S. Pat. No. 7,279,587, which is hereby incorporated by reference herein in its entirety.

SR 399LV is a dipentaerythritol pentaacrylate available from Sartomer Co., Inc.

Irgacure® 819 is a photoinitiator (obtained from BASF).

KIP 150 is a photoinitiator, oligo[2-hydroxy-2-methyl-1-[4-(1-methylvinyl)phenyl]propanone] (available as Esacure® KIP 150 from IGM Resins USA Inc.).

ACR Di-10 is Silmer® a silicone acrylate pre-polymer, available from Siltech Corporation.

ACR Di-50 is Silmer® linear di-functional acrylate-terminated silicone pre-polymer, available from Siltech Corporation.

Irgastab® is a free radical scavenger available from BASF.

Dow Corning® 31-441 additive is a solid silicone polymer used as an additive in polyamide-based composites available from Dow Corning Corporation.

Example 1

An ultra-violet curable phase change gellant composition was prepared having the components in the amounts set forth in Table 1. All of the components were stirred together at 90° C. for 1 hour.

TABLE 1

| Component | Weight Percent |
| --- | --- |
| Amide Gellant | 7.5 |
| Curable Acrlyate Wax | 5 |
| SR399LV | 5 |
| SR 9003 | 72.5 |
| Photoinitiators | 9.5 |
| Irgastab ® UV Stabilizer | 0.4 |

Figure 1:
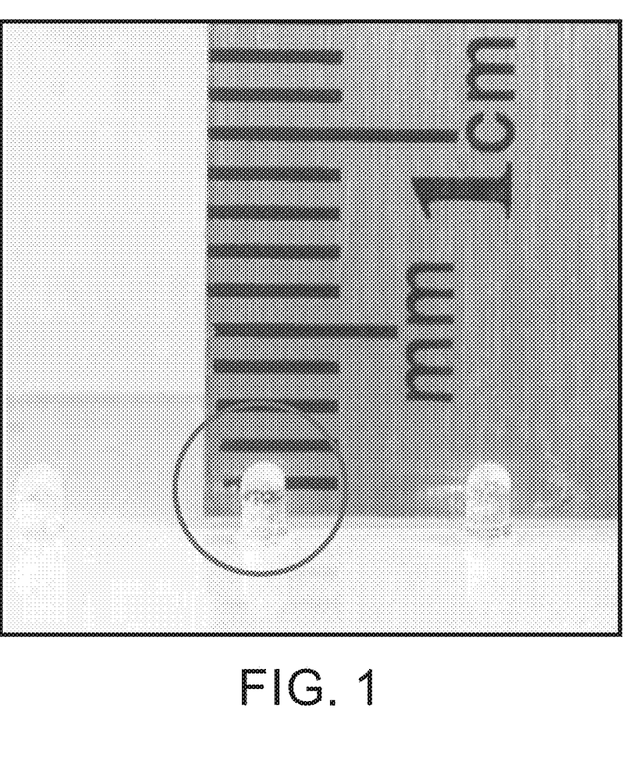
FIG. 1 is an illustration of raised structures prepared with the ultra-violet curable gellant composition of the present application.
Figure 2:
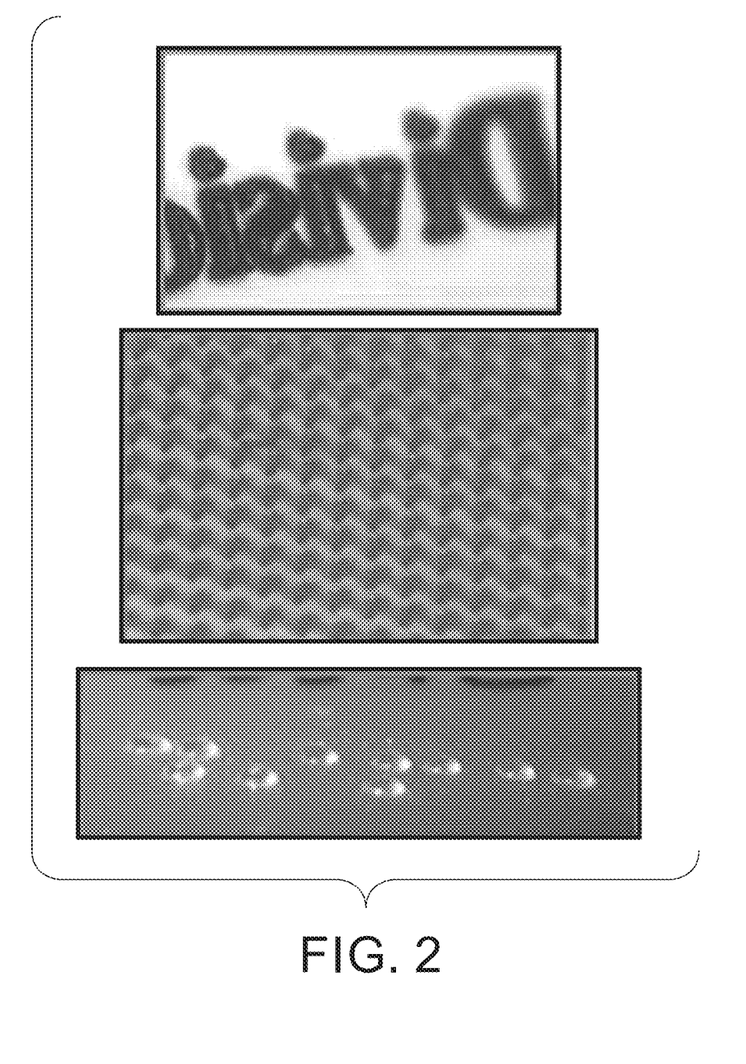
FIG. 2 is an illustration of raised images printed with the ultra-violet curable gellant composition of the present application.

The material of Example 1 was melted at 90° C. and the fluid composition was dispensed by hand from a glass pipette onto a sheet of uncoated Mylar®. Due to the phase change nature of the composition, the dispensed fluid rapidly gelled on contact with the room temperature Mylar allowing the formation of free-standing structures several millimeters in height. FIG. 1 illustrates a free-standing post alongside a ruler, following UV-curing, created from the deposition of the present phase change material of Example 1 onto a room temperature substrate. The deposited three-dimensional structures were then cured by exposure to UV light from a UV Fusion LC-6B Benchtop Conveyor equipped with UV Fusion Light Hammer 6 Ultraviolet Lamp System employing a "D" bulb for a minimum of 1 seconds to provide polymer posts which are remarkably robust. FIG. 2 is an illustration of raised images printed with the composition of Example 1.

Figure 3:
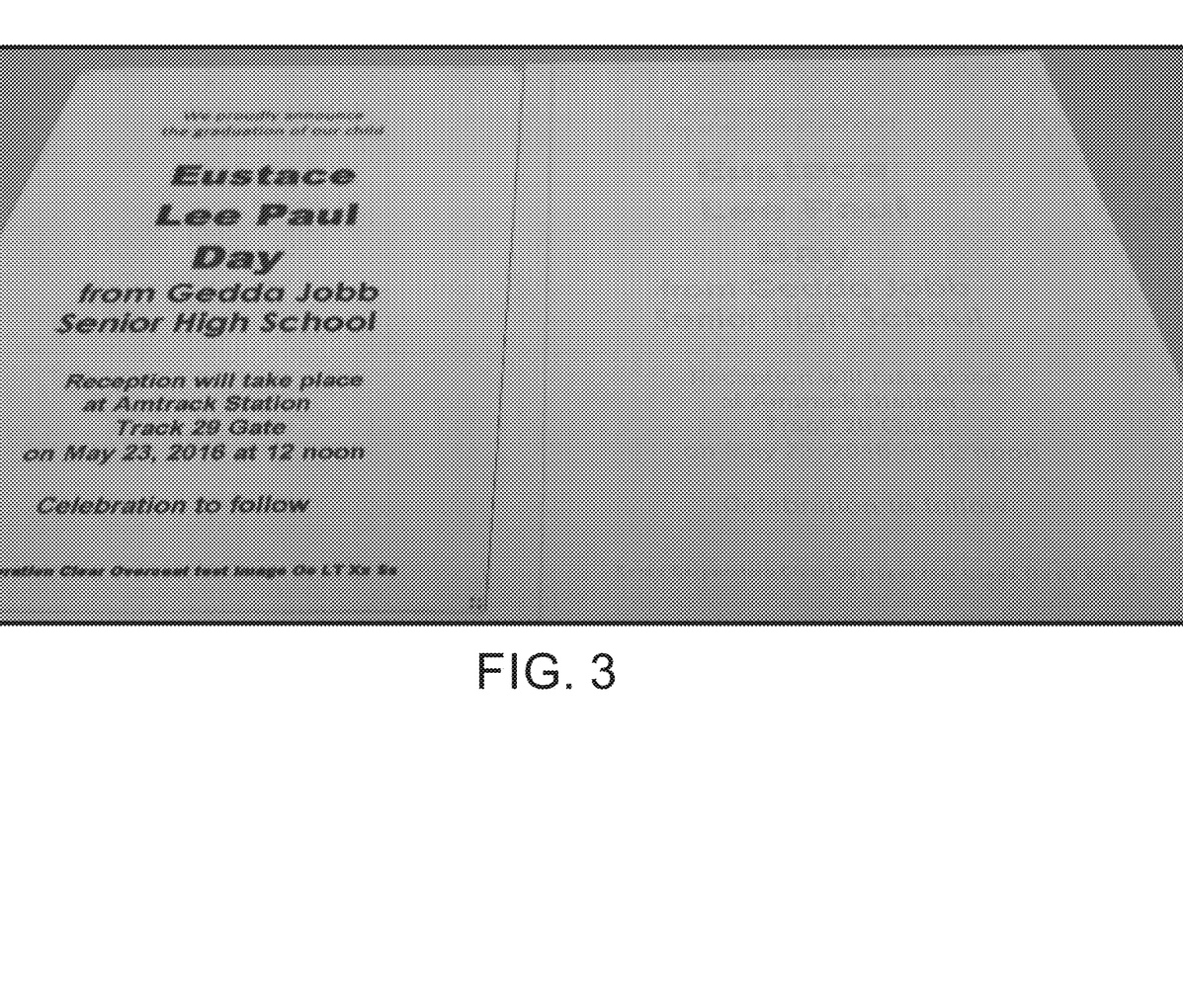
FIG. 3 is an illustration of xerographic images printed with a Xerox® iGen® 5 Press overprinted with a colorless ultra-violet curable gellant composition of the present application to form raised images corresponding to the xerographic images.

FIG. 3 is an illustration of text overprinted with the composition of Example 1. The text of FIG. 3 was generated on a Xerox® iGen® 5 Press. The iGen® 5 xerographic images were then digitally overprinted with the colorless ultra-violet curable gel composition of Example 1 using a Xerox® M-class printhead followed by curing to a robust finish by exposure to UV light from a UV Fusion LC-6B Benchtop Conveyor equipped with UV Fusion Light Hammer 6 Ultraviolet Lamp System employing a "D" bulb for a minimum of 1 seconds.

Multiple passes can be used to dispose the gellant compositions. In embodiments, the gel compositions can be laid down in a single pass but with either very high process direction DPI (dots per inch) or several printheads (i.e., 4) used in concert to achieve the 50 m pile height. The multiple printhead option is used when high speeds are required (iGen® 150 speed is 585 mm/s).

Using this process, fine lines and text and all printed colors generated by the Xerox® iGen® 5 Press could be transformed, in-line, to a raised print. These features are currently unattainable using traditional thermographic processes. The edges of the raised images and text felt "sharp" to the touch which is a desired feature.

Figure 4:
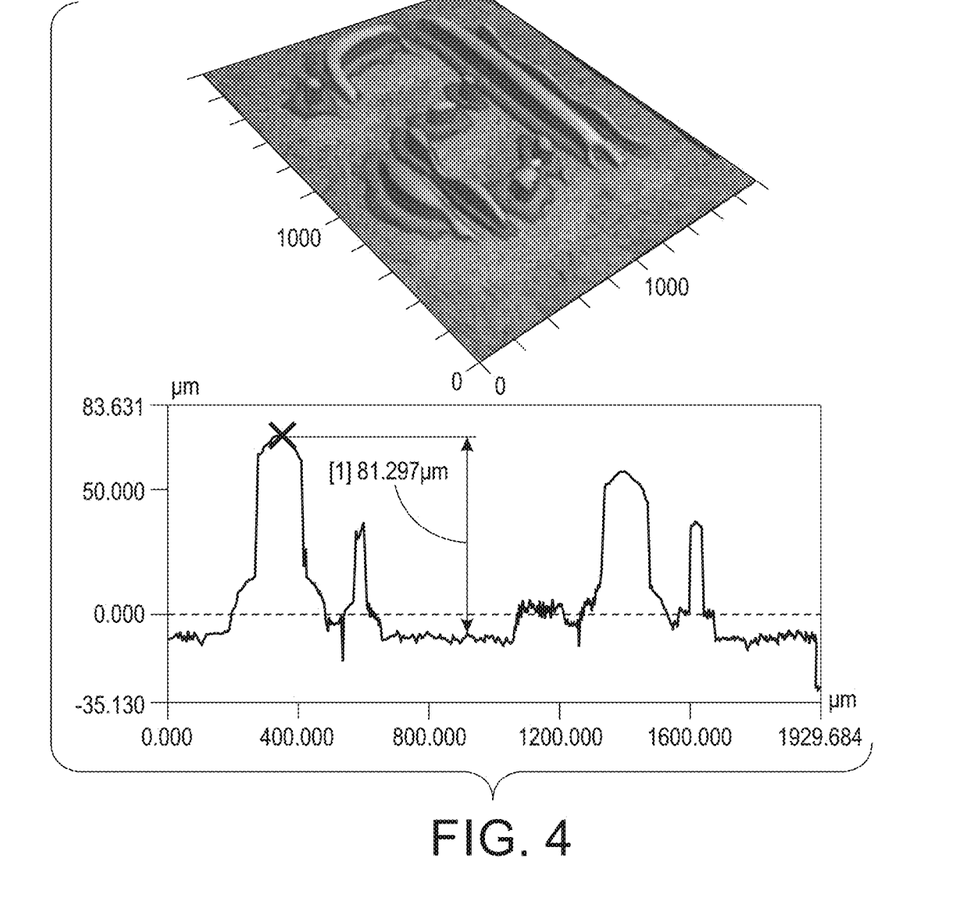
FIG. 4 is an illustration and graph providing height measurements of the letter "a" in the word "Day" in FIG. 3.

FIG. 4 provides height measurements of the letter "a" in the word "Day" of FIG. 3. FIG. 4 shows the actual measured height of the letters validating the height requirement of 40 to 60 micrometers and demonstrates the texture of the text as felt with a fingertip.

Example 2

Example 2 comprising a UV curable non-gellant composition and a UV curable gellant composition was prepared according to the formulations outlined in Table 2. All of the components were stirred together at 90° C. for 1 hour.

TABLE 2

| Component | UV Curable Non-Gellant Composition Portion A (Weight Percent) | UV Curable Gellant Composition Portion B (Weight Percent) |
| --- | --- | --- |
| Amide Gellant | 0 | 7.5 |
| SR399LV | 5.0 | 5.0 |
| SR 9003 | 80.3 | 81.8 |
| Irgacure ® 819 | 1 | 1.0 |
| KIP 150 | 3.5 | 3.5 |
| ACR Di-10 | 10 | 0 |
| ACR Di-50 | 0 | 1 |
| Irgastab ® UV Stabilizer | 0.2 | 0.2 |

Figure 5:
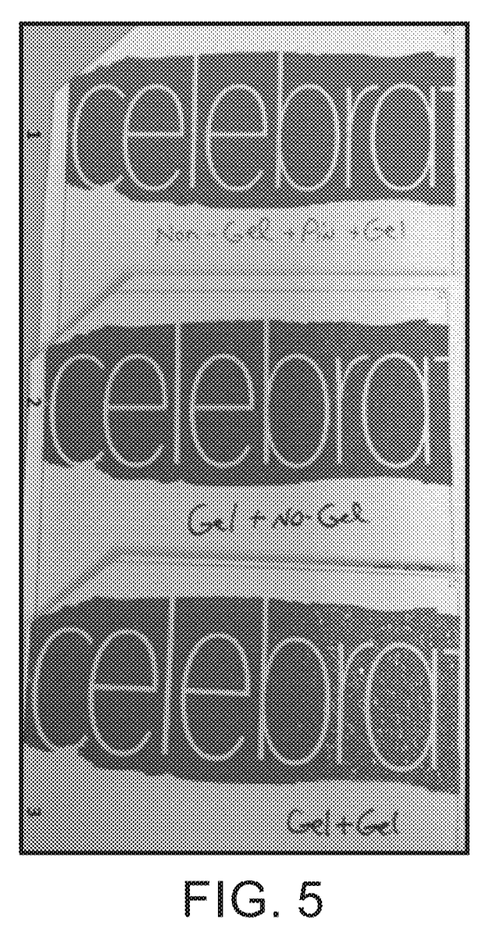
FIG. 5 is an illustration of prints made in accordance with embodiments of the present process.

FIG. 5 is an illustration of text overprinted with the UV curable non-gellant and UV curable gellant compositions of Example 2. The text of FIG. 5 was generated on a Xerox® iGen® 5 Press. The iGen® 5 xerographic images were then digitally overprinted in sequential fashion with the UV curable non-gellant and UV curable gellant compositions of Example 2.

Turning to FIG. 5, top most print, designated 1 (non-gel+pin+gel), was prepared by printing the non-gellant portion A shown in Table 2, pinning the printed non-gellant portion A with a 24 W LED lamp, printing the gellant portion B shown in Table 2, and curing the final image with one to three passes under a Prime UV lamp at 540 mm/s with power readings (nanometers/mJ/cm$^2$) as shown in Table 3.

TABLE 3

| | uvA | uvB | uvC | uvV | sum |
| --- | --- | --- | --- | --- | --- |
| | 320-390 nm | 280-320 nm | 250-260 nm | 395-450 nm | |
| Energy mJ/cm$^2$ | 332 | 142 | 39 | 270 | 783 |

The center print illustrated in FIG. 5, designated 2 (gel+no gel) was prepared by sequentially printing UV gellant composition portion B and UV curable non-gellant composition portion A, followed by curing the final image with one to three passes under a Prime UV lamp at 540 mm/s.

The right-most print illustrated in FIG. 5, designated 3 (gel+gel), was prepared by printing the UV gellant composition Portion B and curing the final image with one to three passes under a Prime UV lamp at 540 mm/s.

Print process option 2 (printing a UV gel composition and non-gel UV composition sequentially, cure final image) produced the most controlled image and was most pleasing to view. The UV non-gel composition when printed alone can penetrate the substrate and is unable to produce the look and height required for certain applications. When two printheads of the UV gel composition are employed, the images can have a rough texture ("corduroy," not smooth), necessitating heating the substrate to enable the UV curable formulation to flow. Using a combination of the UV gel and non-gel compositions enables high quality "embossing" effects with reduced migration into the substrate, good height, and a smoother finish.

Thus, in embodiments, a process for over-coating a substantially flat image to produce raised text and lines is provided using a single UV curable material as described herein. In other embodiments, a process for over-coating a substantially flat image to produce raised text and lines, in embodiments to cover larger raised areas or to achieve enhanced controlled patterning, a dual material process is providing using a combination of a UV curable non-gellant composition and a UV curable gellant composition. In embodiments, the UV curable gellant composition and UV curable non-gellant composition are disposed sequentially over a substantially flat printed image to produce raised text and lines in accordance with the flat printed image.

It will be appreciated that various of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims. Unless specifically recited in a claim, steps or components of claims should not be implied or imported from the specification or any other claims as to any particular order, number, position, size, shape, angle, color, or material.

The invention claimed is:

1. A process comprising:
   providing a substantially flat printed image on a substrate;
   disposing a curable gellant composition onto the printed image in registration with the printed image, wherein the curable gellant composition comprises a radiation curable monomer or prepolymer, a photoinitiator, and a gellant;
   successively depositing additional amounts of the gellant composition to create a raised image in registration with the printed image; and
   curing the deposited raised image,
   wherein the curable gellant composition further comprises a silicone polymer or pre-polymer.

2. The process of claim 1, wherein the printed image is a xerographic image.

3. The process of claim 1, wherein the process comprises an in-line process.

4. The process of claim 1, wherein the cured raised image has a height of greater than 30 micrometers.

5. The process of claim 1, wherein the raised image has a height of from about 40 micrometers to about 60 micrometers.

6. The process of claim 1, wherein curing the deposited curable gellant composition comprises curing after the last of the successive additional amounts of the curable gellant composition are deposited.

7. The process of claim 1, wherein the curable gellant is free of colorant.

8. The process of claim 1, wherein the at least one curable monomer or prepolymer is a multifunctional acrylate or methacrylate compound.

9. The process of claim 1, wherein the photoinitiator is selected from the group consisting of benzyl ketones, monomeric hydroxyl ketones, α-alkoxy benzyl ketones, α-amino ketones, acyl phosphine oxides, metallocenes, benzophenone, benzophenone derivatives, isopropyl thioxanthenones, arylsulphonium salts and aryl iodonium salts.

10. The process of claim 1, wherein the substrate comprises a member of the group consisting of plain paper, ruled notebook paper, bond paper, silica coated paper, glossy coated paper, transparency materials, fabrics, textile products, plastics, polymeric films, metal, wood, wax, and salts.

11. A process comprising:
    providing a substantially flat printed image on a substrate;
    disposing a curable gellant composition onto the printed image in registration with the printed image; and
    disposing a curable non-gellant composition onto the printed image in registration with the printed image to create a raised image in registration with the printed image; and
    curing the deposited raised image,
    wherein the curable gellant composition further comprises a silicone polymer or pre-polymer.

12. The process of claim 11, wherein the printed image is a xerographic image.

13. The process of claim 11, wherein the raised image has a height of from about 40 micrometers to about 60 micrometers.

14. The process of claim 11, wherein curing the deposited raised image comprises curing after the last of successive additional amounts of the curable non-gellant composition and curable gellant composition are deposited.

15. The process of claim 11, wherein the raised image created is a Braille image.

16. The process of claim 11, wherein the curable gellant composition and the curable non-gellant composition are disposed sequentially onto the substantially flat printed image;
    wherein the curable gellant composition is disposed first and the curable non-gellant composition is disposed second.

17. The process of claim 11, wherein the curable non-gellant composition comprises a radiation curable monomer or prepolymer, and a photoinitiator; and
    wherein the curable gellant composition comprises a radiation curable monomer or prepolymer, a photoinitiator, and a gellant.

* * * * *